United States Patent [19]
Jiang

[11] Patent Number: 5,940,337
[45] Date of Patent: Aug. 17, 1999

[54] METHOD AND APPARATUS FOR CONTROLLING MEMORY ADDRESS HOLD TIME

[75] Inventor: Yong H. Jiang, Milpitas, Calif.

[73] Assignee: Integrated Silicon Solution, Inc., Santa Clara, Calif.

[21] Appl. No.: 08/956,835

[22] Filed: Oct. 23, 1997

[51] Int. Cl.$^6$ ....................................................... G11C 7/00
[52] U.S. Cl. ........................................ 365/203; 365/233.5
[58] Field of Search ................................ 365/203, 233.5, 365/233, 230.08, 230.06

[56] References Cited

U.S. PATENT DOCUMENTS

| | | | |
|---|---|---|---|
| 4,658,381 | 4/1987 | Reed et al. | 365/203 |
| 4,996,671 | 2/1991 | Suzuki et al. | 365/203 |
| 5,062,082 | 10/1991 | Choi | 365/233.5 |
| 5,091,889 | 2/1992 | Hamano et al. | 365/203 |
| 5,229,966 | 7/1993 | Uhsawa et al. | 365/230.08 |
| 5,331,595 | 7/1994 | Inoue | 365/203 |
| 5,343,432 | 8/1994 | Matsuo et al. | 365/203 |
| 5,479,374 | 12/1995 | Kobayashi et al. | 365/233.5 |
| 5,548,560 | 8/1996 | Stephens, Jr. et al. | 365/233.5 |
| 5,825,693 | 10/1998 | Lee et al. | 365/233.5 |
| 5,835,440 | 11/1998 | Manning | 365/233.5 |

*Primary Examiner*—Tan T. Nguyen
*Attorney, Agent, or Firm*—Gary S. Williams; Pennie & Edmonds LLP

[57] ABSTRACT

A self timed memory address control circuit is described. A Y address signal is pre-decoded and then latched. Address transition detection circuits coupled to X and Y address lines output a pulse to an equalization circuit whenever one of the corresponding address signals change. The WEB address detection circuit outputs a pulse when the WEB signal switches high. When the equalization circuit receives one of these pulses it generates an output pulse to an equalization transistor that is coupled between two local I/O bus lines. The equalization circuit output pulse turns on this transistor to equalize the local I/O bus lines so as to prevent data from being written with them. The equalization circuit also outputs a pulse to a clock generator circuit. The clock generator circuit generates a clock signal which clocks the latch. This causes the latch to couple the pre-decoded output signals to a decoder. The decoder then combines the pre-decoded address signals with other control signals. The decoder then activates the appropriate column select lines. Shortly thereafter the equalization pulse switches low, and a write pulse signal switches high to write data into the selected memory cell. This ensures that at the end of a write operation, when the Y address changes and WEB changes from low to high, the column select will change only after the equalization signal is asserted. The equalization pulse remains high to keep the local I/O bus lines equalized until after the write pulse has switched low. This thereby avoids the uncertainty in the matched delay requirements between the equalization signals and the decoded address signals of conventional asynchronous memory devices and prevents data from being improperly written into the memory address for the subsequent cycle.

12 Claims, 8 Drawing Sheets

METHOD AND APPARATUS FOR CONTROLLING MEMORY ADDRESS HOLD TIME

The present invention relates generally to memory devices, and particularly to asynchronous semiconductor memory devices.

BACKGROUND OF THE INVENTION

Conventional asynchronous memory devices rely upon matched memory access signal delays for proper operation. Changing operating conditions and other factors can cause variations in signal timing that can create memory write errors. The following background is provided to more clearly describe this problem.

Figure 1:
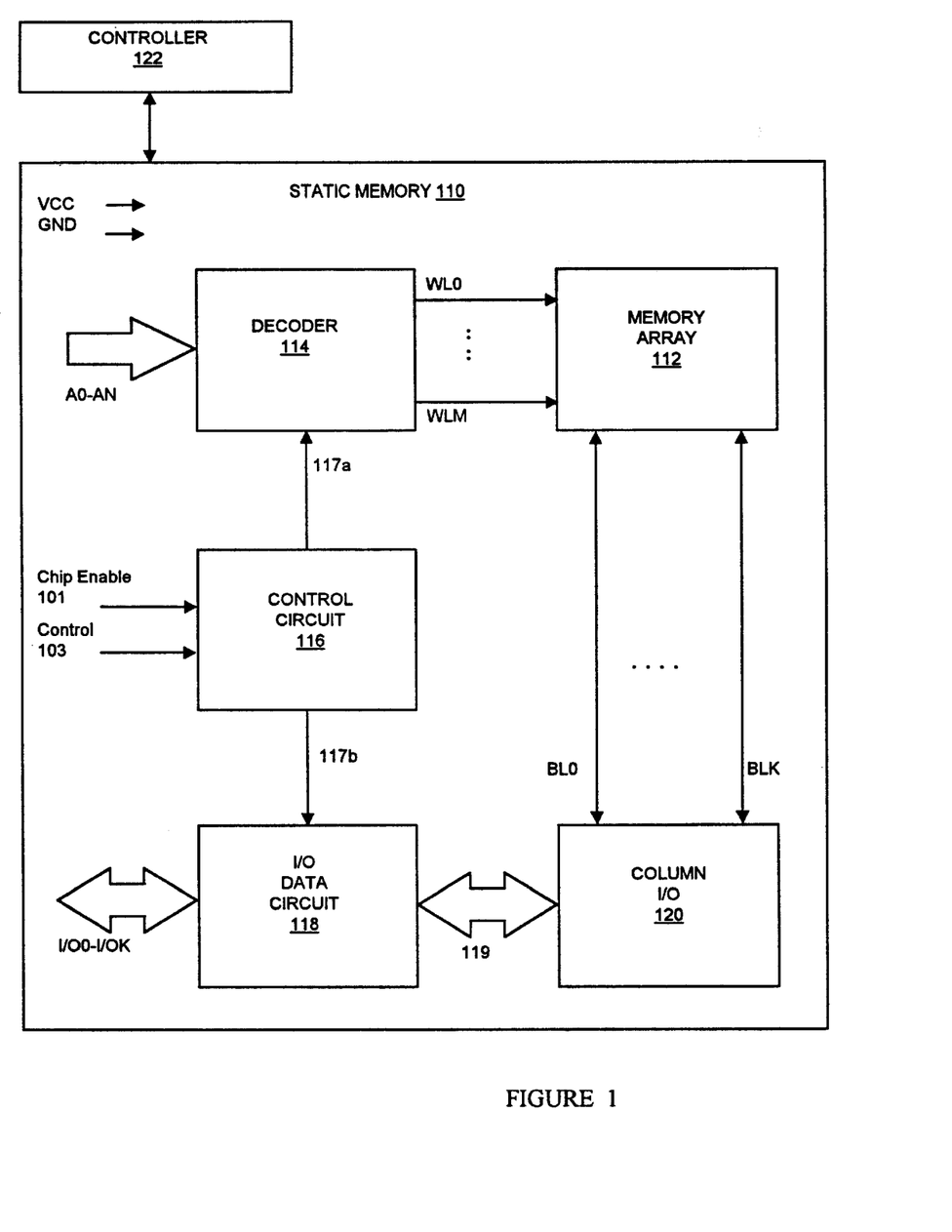
FIG. 1 illustrates a block diagram of a static memory device in which the present invention can be implemented.

Static Random Access Memories (SRAMs) are widely used high speed memory devices. The operation of SRAMs is well known and therefore is only briefly described herein. FIG. 1 illustrates a block diagram of an SRAM 110. The controller 122 initiates a memory operation by asserting a chip enable signal 101 and supplying address signals A0–AN (corresponding to $2^{N+1}$ memory locations) designating the address of a memory location where the operation is to be performed. If the memory operation is a write operation, the controller 122 supplies the data to be written to the addressed memory location via the bidirectional input/output lines I/O0–I/OK (corresponding to K+1 bit memory words). If the memory operation is a read operation, the stored information from the addressed location is read out from the same bidirectional input/output lines I/O0–I/OK. The memory 110 also provides connections for external power supply (VCC) and ground (GND) signals.

The heart of the memory 110 is the memory array 112, which consists of static memory cells, each capable of storing one bit of data, arranged in rows and columns. In the conventional manner, all of the cells in one row are energized for a memory operation (either a read or a write) by a word line WL uniquely associated with that row. A memory operation cannot be performed unless the word line associated with the target row of cells is activated.

At least a subset of the cells in a row (typically all of the cells that store data for one memory word) can be accessed simultaneously for a given memory operation via the bit lines BL. When the memory operation is a read, the bit lines BL are coupled to sense amplifiers in the column I/O 120 that sense the data stored in the corresponding cells of the row whose word line WL is active. When the memory operation is a write the bit lines BL carry the signals used to program the corresponding cells of the row associated with the active word line.

The control circuitry 116 controls the other blocks of the memory 110 in response to the chip enable signal 101. Depending on the operation to be performed, the control circuitry issues the appropriate control signals 117a, 117b to the decoder 114 and the I/O data circuit 118, respectively.

Regardless of whether the memory operation is a write or a read, the decoder 114 decodes the address signals A0–AN and activates the word line WL of the row that includes the memory word that is the target of the current memory operation.

If the operation is a write, the I/O data circuitry 118 buffers the input data signals I/O0–I/OK and outputs the buffered data to the column I/O 120 via the bi-directional data bus 119. The column I/O 120 then latches the input signals in parallel onto the corresponding bit lines BL0–BLK. The signals on the bit lines BL0–BLK are used to program the cells composing the word whose word line was activated for the current operation by the decoder 114.

If the operation is a read, sense amplifiers (SA) in the column I/O 120 sense the signals on the respective bit lines BL, convert the sensed signals into binary (e.g., high or low) voltages that represent the programmed state of the addressed word and output the word's bit values to the I/O data circuit via the bi-directional bus 119. The output data are buffered by the I/O data circuit 118 and latched onto the bi-directional data lines I/O0–I/OK for use by the controller 122.

Figure 2:
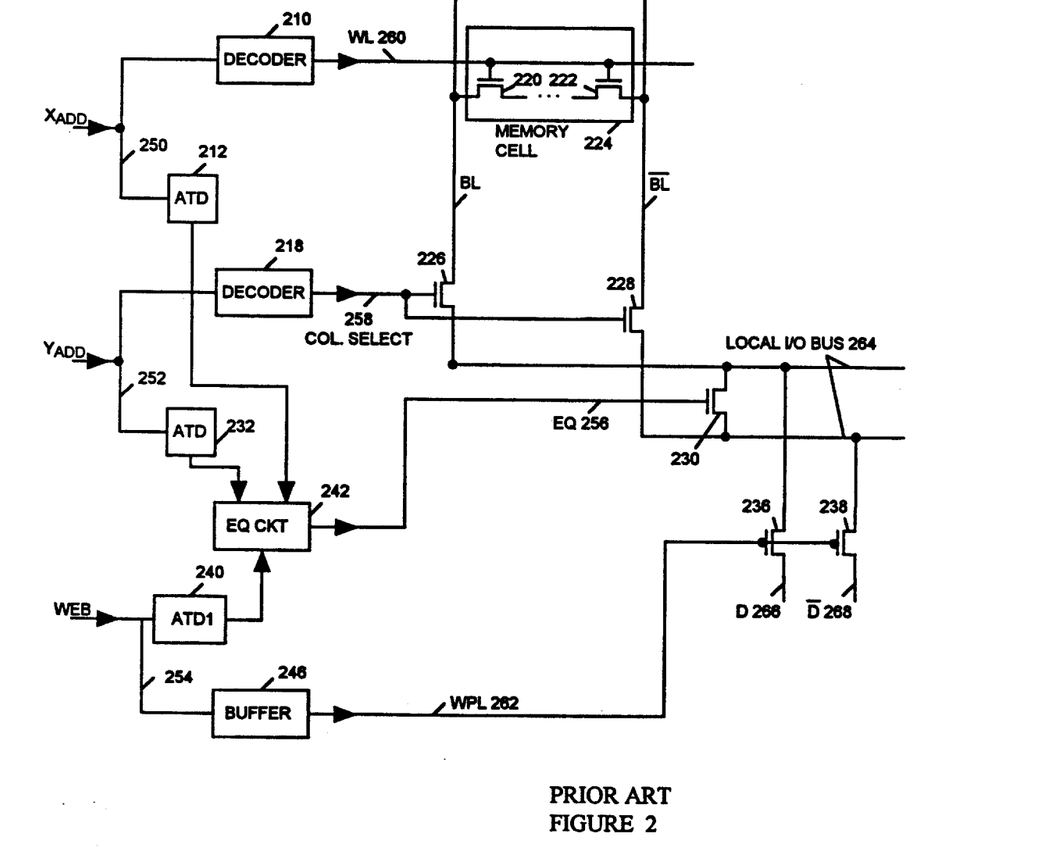
FIG. 2 illustrates a conventional static memory device address control circuit.

FIG. 2 illustrates a conventional static memory device address control circuit. Y address signals 252 are coupled to decoder 218 and to address transition detection circuit (ATD) 232. The output of decoder 218 is a column select line 258 which couples the corresponding bit line and bit bar line pair to the local I/O bus 264. Similarly the X addresses are coupled to an address transition detection circuit 212 and a decoder 210. The output of decoder 210 drives a word line 260 which selects a memory cell 224.

The X address signal 250 and Y address signal 252 are typically each comprised of a plurality of address lines. Similarly, typically decoder 210 has a plurality of word line outputs, and decoder 218 has a plurality of column select outputs. These word lines and column select lines access an array of memory cells 224. For simplicity, only one small part of this array is illustrated in FIG. 2 with a single memory cell 224.

The address transition detection circuits 212 and 232 output a pulse upon a rising edge or falling edge input transition. Therefore when an X address line or a Y address line changes the corresponding address transition detection circuit outputs a pulse to equalization circuit 242. Equalization circuit 242 equalizes local I/O bus 264 to prevent data from being written while equalization signal 256 is asserted.

Figure 2A:
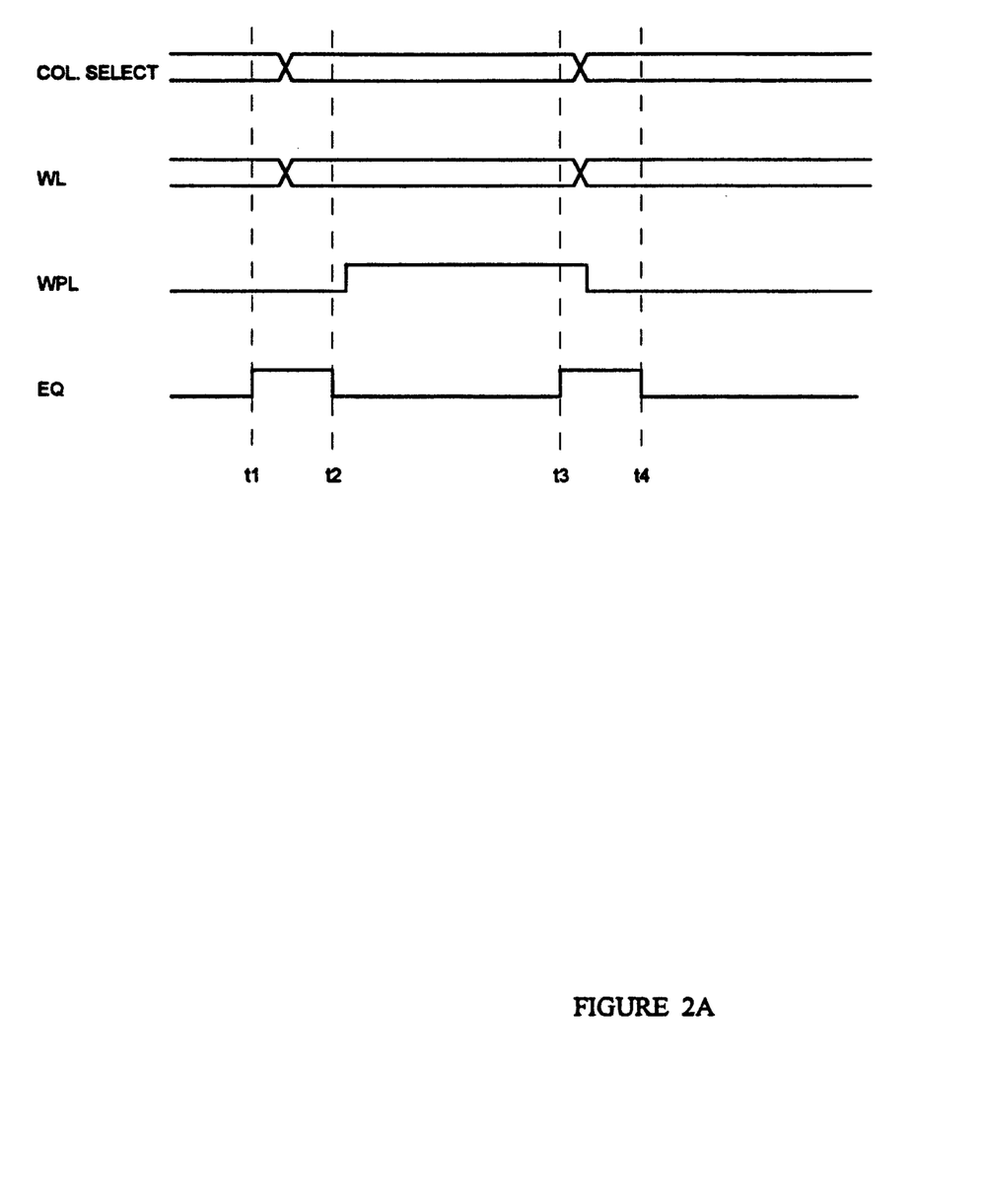
FIG. 2A illustrates a timing diagram for the circuit of FIG. 2.

A timing diagram for the FIG. 2 conventional static memory device address control circuit is illustrated in FIG. 2A. In FIG. 2A a new Y address is received prior to time t1. These address line transitions cause the EQ 256 signal to switch high at time t1. After EQ 256 switches high column select line 258 and word line 260 are selected. At time t2 the EQ 256 signal is deasserted, and shortly thereafter the write pulse (WPL) 262 signal is asserted. With WPL 262 high, data defined by data lines D 266 and $\overline{D}$ 268 are written to the selected memory cell.

At the end of a write operation, the X address, Y address, and WEB signals can all change at the same time. The EQ 256 pulse at time t3 is intended to prevent the write pulse from writing data into the memory address for the next cycle. FIG. 2A illustrates the desired timing relationship where the column select and word lines do not change until either the write pulse is at a low level or the equalization signal has been asserted to prevent a high write pulse from writing data. A problem with this type of built-in "hold time" asynchronous memory device is that at the end of a write operation when the X address, Y address and WEB signals change, if an address signal passes through a decoder too quickly then it can cause a column select line or a word line to switch while the write pulse is still high and before the equalization signal has been asserted. This causes the write pulse to write data to the wrong address. In other words, if column select changes before time t3 it causes an error.

Conventional memory devices use delays in the decoder path to attempt to match the decoder path delay and the WEB/WPL 262 path delay so as to avoid writing data to the wrong address. However, because the Y address and the WEB signals typically originate from different locations in the memory chip, they do not track very well. The two signals may track poorly for a variety of reasons including voltages differences at different locations on the chip, different pin locations, variations in the loading conditions and other factors. Variations in the timing relationship between the WEB signal and the Y address signal can cause data to be written to the wrong Y address.

Thus, there is a need for a memory address control circuit that overcomes the Y address and WEB timing problem as well as other problems of the prior art.

SUMMARY OF THE INVENTION

In summary, the present invention provides a self timed memory address control circuit. In one embodiment, a Y address signal is pre-decoded and then latched. Address transition detection circuits are coupled to the X address, Y address and write enable bar (WEB) signals of a memory address control circuit. The address transition detection circuits coupled to the X and Y address lines output a pulse to an equalization circuit whenever one of the corresponding address signals change. The WEB address detection circuit outputs a pulse when the WEB signal switches high. When the equalization circuit receives one of these pulses it generates an output pulse to an equalization transistor that is coupled between two local I/O bus lines. The equalization circuit output pulse turns on this transistor to equalize the local I/O bus lines so as to prevent data from being written with them. The equalization circuit also outputs a pulse to a clock generator circuit. The clock generator circuit generates a clock signal which clocks the latch. This causes the latch to couple the pre-decoded output signals to a decoder. The decoder then combines the pre-decoded address signals with other control signals, such as a memory bank selection signal. The decoder then activates the appropriate column select lines. Shortly thereafter the equalization pulse switches low, and a write pulse signal switches high to write data into the selected memory cell.

Using the latch controlled by a clock signal generated by the equalization circuit ensures that at the end of a write operation, when the Y address changes and WEB changes from low to high, the column select will change only after the equalization signal is asserted. The equalization pulse remains high to keep the local I/O bus lines equalized until after the write pulse has switched low. This thereby avoids the uncertainty in the matched delay requirements between the equalization signals and the decoded address signals of conventional asynchronous memory devices and prevents data from being improperly written into the memory address for the subsequent cycle. The present invention thereby solves the hold time problem.

BRIEF DESCRIPTION OF THE DRAWINGS

Additional objects and features of the invention will be more readily apparent from the following detailed description and appended claims when taken in conjunction with the drawings, in which:

DESCRIPTION OF THE PREFERRED EMBODIMENT

Figure 3:
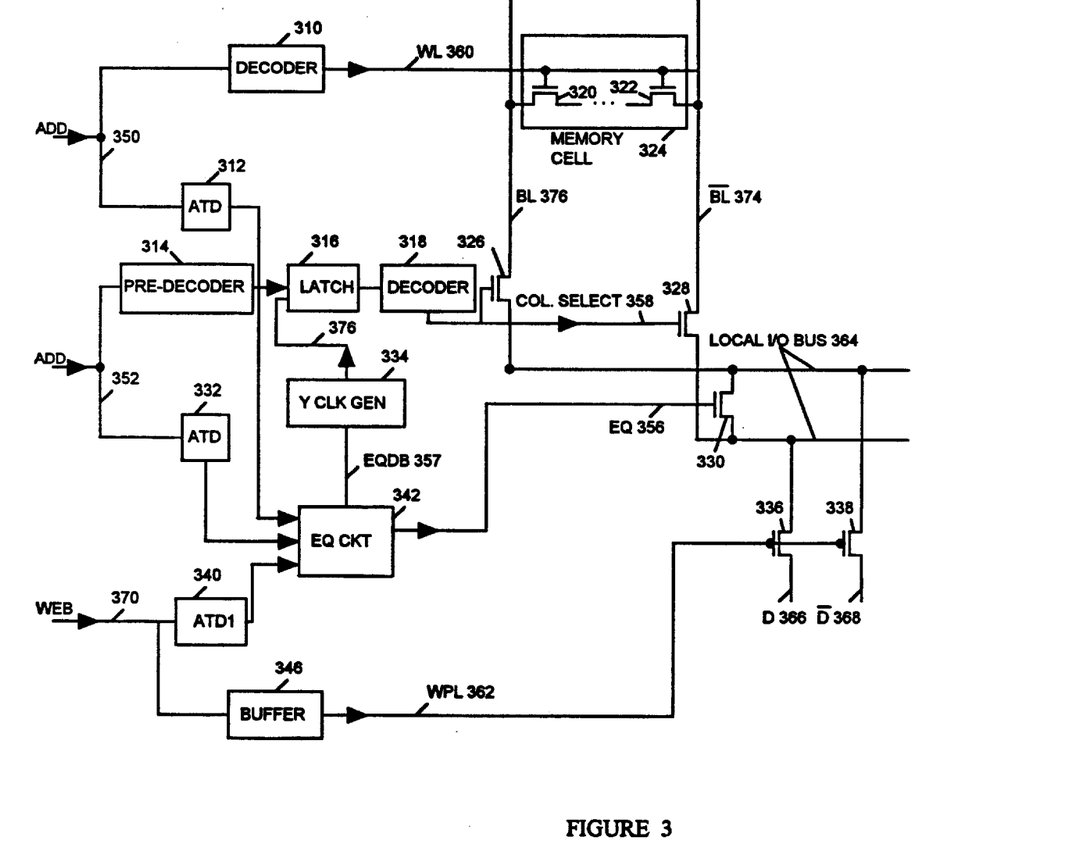
FIG. 3 illustrates a static memory device address control circuit according to one embodiment of the present invention.

FIG. 3 illustrates a static memory device address control circuit according to one embodiment of the present invention. The address control circuit of FIG. 3 provides improved reliability and simplifies the memory design process by controlling the timing relationship between column address changes and the equalization of the data I/O lines.

The address control circuit of FIG. 3 includes X address lines 350, associated address transition detection (ATD) circuit 312 and decoder 310. The single line 350 represents a plurality of X address lines. For example, in a 4K bit memory array comprising 64×64 cells there are 6 X address lines which are inputs to decoder 310, and 64 word lines at the decoder 310 output. Each of the 64 word lines is coupled to a row of 64 memory cells.

The Y address line 352 is also comprised of a plurality of Y address lines. In the 4K bit array example, there are 6 Y address lines. The Y address lines are coupled to address transition detection circuit 332. Address transition detection circuits 312 and 332 output a pulse upon a rising or falling edge input signal transition. Therefore address transition detection circuits 312 and 332 output a pulse to equalization circuit 342 whenever the X address or Y address lines change.

The write enable bar (WEB) 370 signal is the source of the third input to equalization circuit 342. The WEB 370 signal is coupled to unidirectional address transition detection circuit ATD1 340. ATD1 340 outputs a pulse to equalization circuit 342 when WEB 370 switches high. ATD1 340 does not output a pulse when WEB 370 switches low. The WEB 370 signal is also coupled to buffer 346. WEB 370 is an active low signal. The output of buffer 346 is the write pulse (WPL) 362 signal. Buffer 346 inverts the WEB 370 signal to generate the active high WPL 362 signal. WPL 362 controls the transistors 336 and 338 which couple the data lines D 336 and $\overline{D}$ 368 to local I/O bus 364.

When one of the inputs to the equalization circuit 342 is asserted, equalization circuit 342 outputs a pulse on the equalization 356 signal output and on the equalization clock EQDB 357 signal output. When the equalization 356 signal is asserted it turns transistor 330 on which equalizes the local I/O bus lines 364 and where transistor 330 is sufficiently strong, this prevents data from being written to memory cells coupled to the corresponding bit lines.

Figure 4:
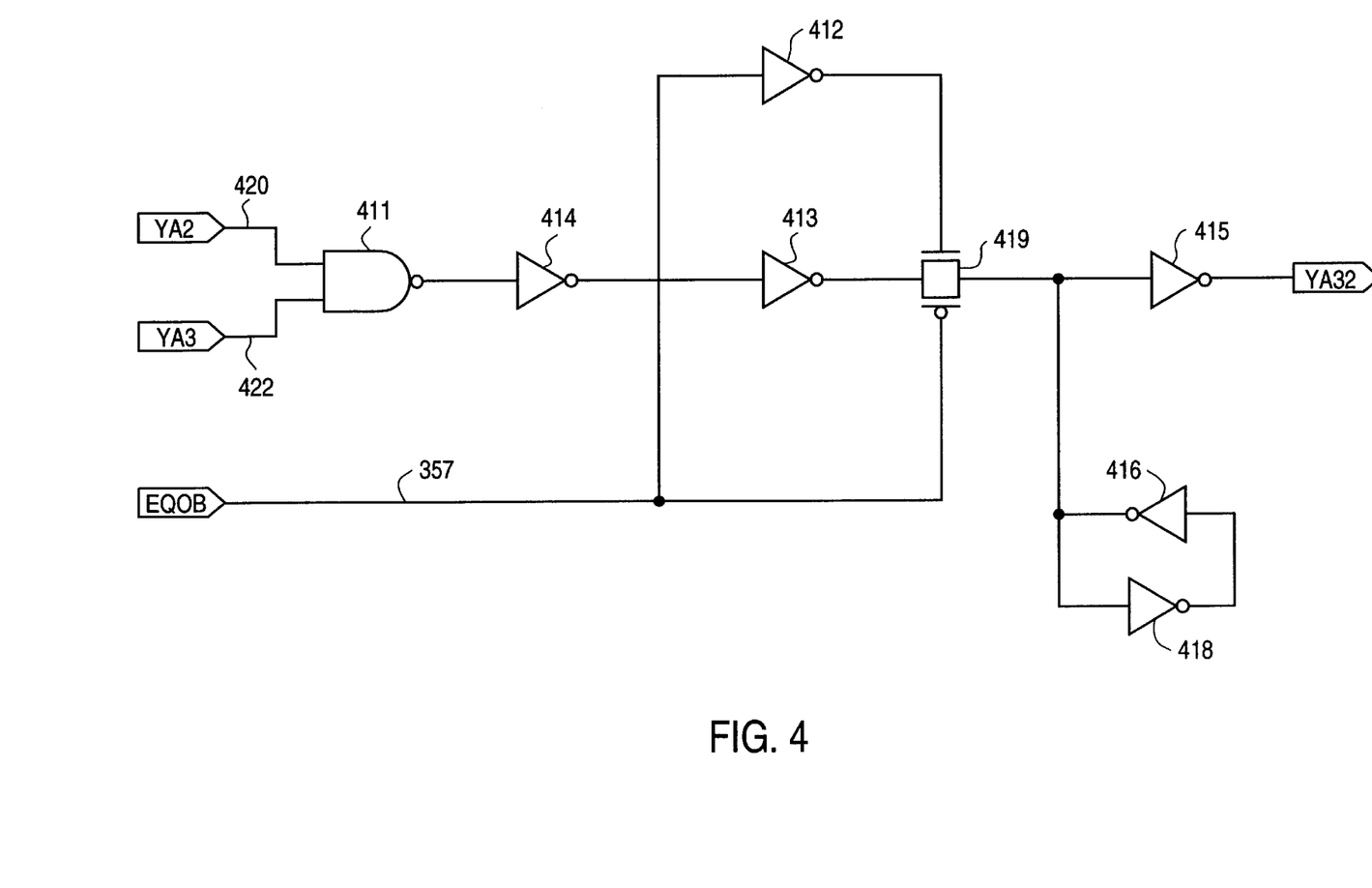
FIG. 4 illustrates a component of a pre-decode circuit and latch according to one embodiment of the present invention.
Figure 5:
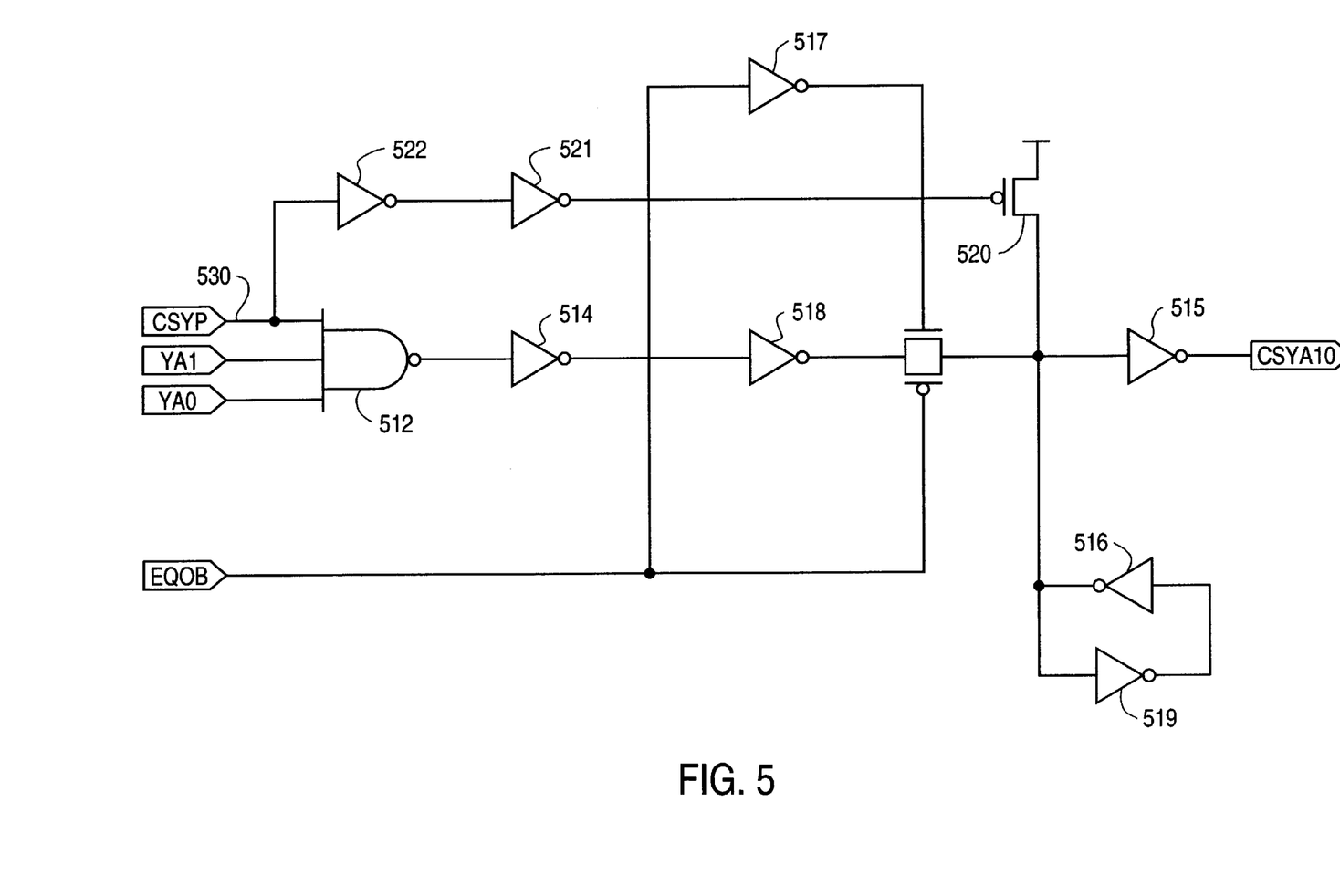
FIG. 5 illustrates a component of a pre-decode circuit and latch according to a further embodiment of the present invention.
Figure 6:
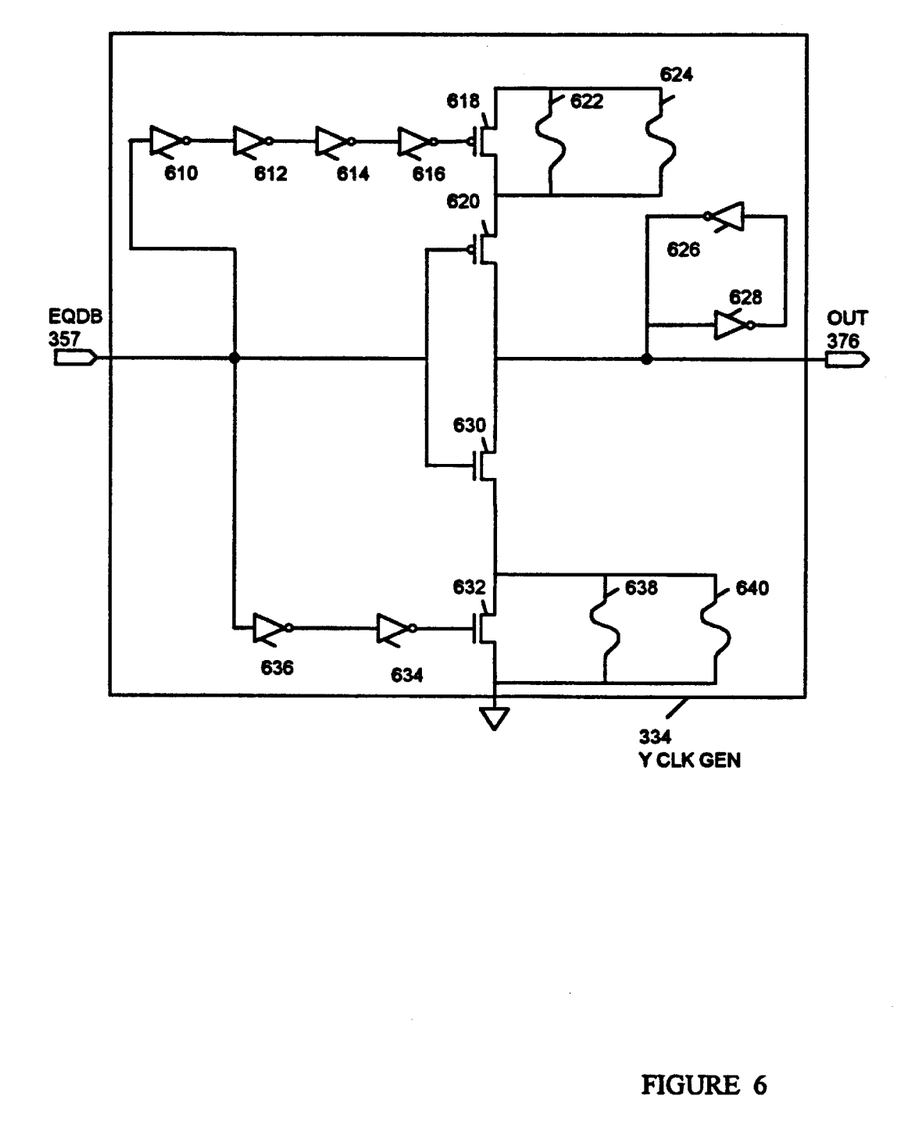
FIG. 6 illustrates a Y clock generator circuit according to one embodiment of the present invention.

The EQDB 357 signal is coupled to the Y clock generator circuit 334. Y clock generator 334 inverts the EQDB 357 pulse and can also be used to modify the timing of the pulse. A Y clock generator 334 circuit embodiment is illustrated in FIG. 6. Y clock generator 334 outputs an active low pulse to latch 316. Embodiments of pre-decoder 314 and latch 316 are illustrated in FIGS. 4 and 5. Latch 316 prevents the selected column address from changing until after equalization circuit 342 equalizes the I/O bus lines 364. When latch 316 is clocked, it couples a Y address signal from pre-decoder 314 to decoder 318. Decoder 318 combines the pre-decoder 314 output signals with other control signals. For example, in an embodiment with multiple banks of memory, decoder 318 can AND the pre-decoder 314 output with a bank control signal that determines which memory bank is accessed.

The address timing control circuitry of the present invention prevents a write pulse from writing data to a memory cell intended to be written in the subsequent cycle. The present invention thereby avoids the problems of matched delays of conventional asynchronous memory devices and the corresponding vulnerability to errors. Generating the EQDB 357 signal and the equalization signal EQ 356 from the same source provides tight timing control of the equalization and memory line selection processes. In the embodiment of FIG. 3 the memory lines being selected comprise column select lines. The controlled timing relationships of the present invention thus provide improved memory access reliability. The present invention also simplifies the memory design process because it avoids the delay matching requirements of conventional asynchronous memory.

Figure 3A:
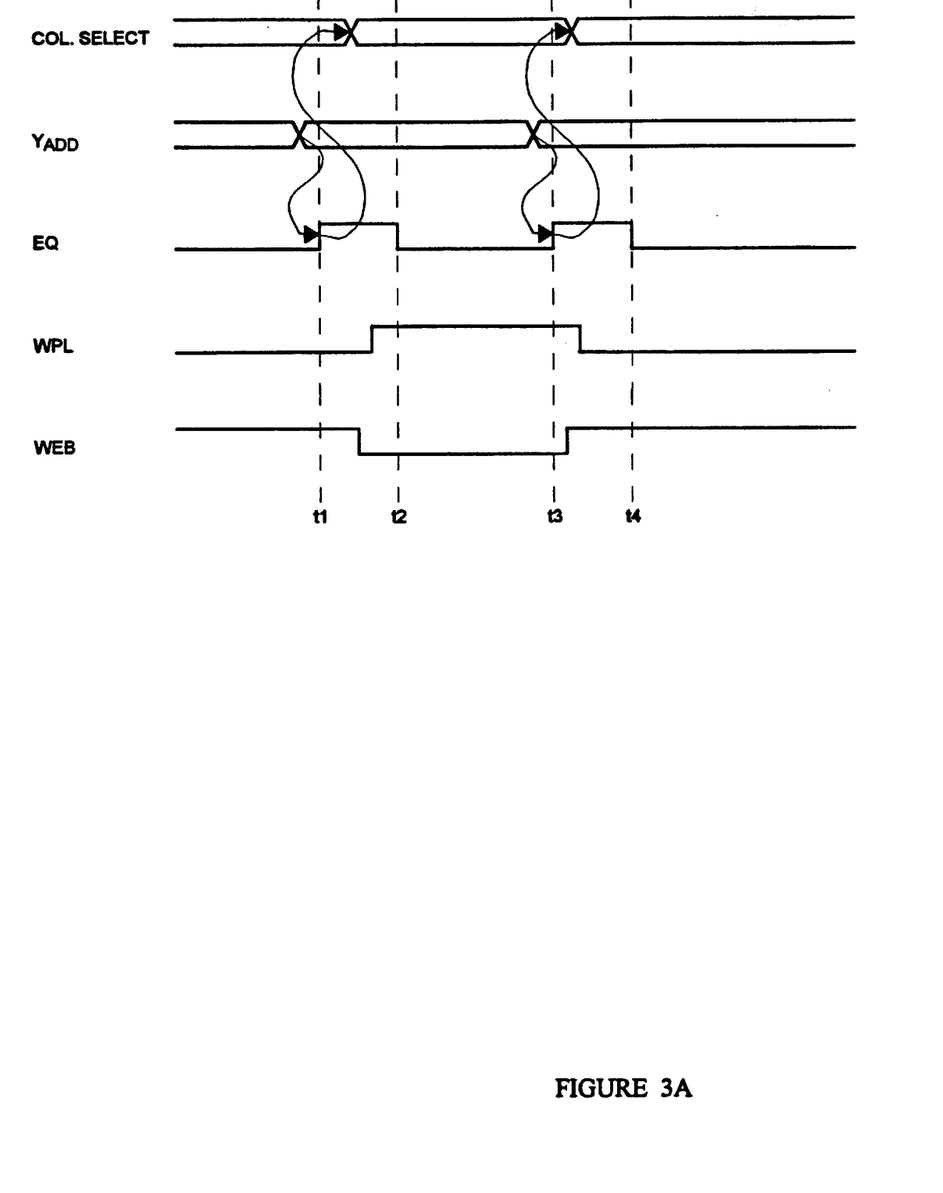
FIG. 3A illustrates a timing diagram for the circuit of FIG. 3.

A timing diagram illustrating the operation of the FIG. 3 address control circuit is illustrated in FIG. 3A. A change in the Y address line causes the equalization circuit 342 to output a pulse starting at time t1. Shortly thereafter the write enable bar signal WEB 370 switches low. The WEB 370 signal is inverted by buffer 346 to produce write pulse WPL 362. The equalization circuit 342 output pulse is also coupled to Y clock generator 334, which in turn clocks latch 316. When latch 316 is clocked the pre-decoded Y address signal is coupled to decoder 318 which then changes the column select address. At time t2, the EQ 356 switches low and the write pulse WPL 362 causes data to be written to the memory cell selected by the column select signal and the row decoder.

After data has been written to the memory cell, a new Y address is received at Y address line 352. This causes equalization circuit 342 to output a pulse at time t3. EQ 356 being asserted prevents a high WPL 362 signal from writing data to the column address for the next cycle as defined by the column select line which changes shortly after EQ 356 is asserted at time t3. EQ 356 remains high until time t4, which is after WPL 362 switches low.

FIG. 4 illustrates a component of a pre-decode circuit and latch according to one embodiment of the present invention. Pre-decoder 314 activates an output line that corresponds to the input address. In one embodiment, pre-decoder 314 has N inputs and $2^N$ outputs. Each combination of the N inputs uniquely defines one of the $2^N$ output address lines. For example, a pre-decoder may have three inputs and eight outputs. An input of "010" may be received, the pre-decoder then activates the one output line that corresponds to "010" and deactivates the other seven lines. In the pre-decode component illustrated in FIG. 4, two address lines YA2 420 and YA3 422 are inputs to NAND gate 411. The NAND gate output is inverted by inverter 414 and restored by inverter 413. The EQDB 357 signal is an output of equalization circuit 342, illustrated in FIG. 3. Pass gate 419 and back to back inverters 416 and 418 provide the latch 316 function for the YA32 output address line. When EQDB 357 switches low this turns on pass gate 419 and couples the address signal to inverter 415 and the output YA32. Back to back inverters 416 and 418 then maintain the output signal. When EQDB 357 is high pass gate 419 is open which prevents any address changes from being coupled to the output YA32. The operation of pre-decoders is known by those of ordinary skill in the art.

FIG. 5 illustrates a component of a pre-decode circuit and latch according to a further embodiment of the present invention. The FIG. 5 pre-decoder circuit includes a chip select control signal CSYP 530. The present invention can be used in systems comprising several banks of memory. In these systems a chip select signal can be used to identify which bank of memory a particular address is directed to. When the chip select signal CSYP 530 is deasserted then all the pre-decode outputs are deasserted and the memory array corresponding to that pre-decoder is not accessed.

FIG. 6 illustrates a Y clock generator circuit according to one embodiment of the present invention. The Y clock generator embodiment of FIG. 6 provides an inverted output signal and allows for modification of the output pulse width using fuses 622, 624, 638 and 640. The input to the Y clock generator circuit 334 is the equalization circuit 342 output signal EQDB 357. When EQDB 357 switches high it turns on N-channel transistor 630. Shortly thereafter, when the EQDB high transition propagates through inverters 636 and 634, N-channel transistor 632 turns on. With transistors 630 and 632 on, the output OUT 376 is pulled low. With EQDB 357 high P-channel transistors 618 and 620 are off.

When EQDB 357 switches low this turns off N-channel transistor 630. With transistor 630 off, OUT 376 is isolated from ground. EQDB 357 being low turns on P-channel transistor 620. After the high to low transition propagates through inverters 610, 612, 614 and 616, P-channel transistor 618 turns on. With transistors 618 and 620 on, OUT 376 is driven high. In this manner, Y clock generator 334 converts the active high pulse output from equalization circuit 342 to an active low pulse output to latch 316.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

Thus an improved method and apparatus for controlling memory address hold time has been described.

What is claimed is:

1. A method of accessing memory, comprising the steps of:

generating a latch clock signal and an equalization signal when any of a predefined set of address signals change value;

responding to the latch clock signal by storing a predecoded address signal in a latch;

responding to the equalization signal by equalizing I/O lines;

decoding a combination of a first subset of the predefined set of address signals and the predecoded address signal stored in the latch to generate a decoded address signal; and activating memory lines in accordance with the decoded address signal.

2. The method of claim 1 wherein said I/O lines are equalized before said memory lines defined by said address signal are activated.

3. The method of claim 1 wherein said memory is an asynchronous SRAM.

4. The method of claim 3 further comprising the step of generating the latch clock signal and the equalization signal when a write enable signal switches to a predetermined signal level.

5. The method of claim 4 further comprising the step of pre-decoding a second subset of the predefined set of address signals before said step of storing the predecoded address signal in a latch.

6. The method of claim 5 wherein said equalizing step includes switching on a transistor coupling two I/O bus lines.

7. A memory address control circuit comprising:

a decode circuit having an input terminal and an output terminal;

a first address transition detection circuit having an input terminal and an output terminal;

an equalization circuit having a plurality of input terminals, an output terminal and a clock terminal, said first address transition detection circuit output terminal coupled to one of said equalization circuit input terminals;

a clock generator having an input terminal and an output terminal, said clock generator input terminal coupled to said equalization circuit clock terminal; and a latch having an input terminal, an output terminal and a clock terminal, said latch output terminal coupled to said decode circuit input terminal, said latch clock terminal coupled to said clock generator output terminal;

wherein said equalization circuit outputs a clock signal at said equalization circuit clock terminal when at least one of said plurality of equalization circuit input terminals receives a signal of a predetermined level.

8. The circuit of claim 7 further comprising a pre-decode circuit having an input terminal and an output terminal, said latch input terminal coupled to said pre-decode circuit output terminal.

9. The circuit of claim 8 wherein said memory device comprises an asynchronous SRAM.

10. The circuit of claim 9 further comprising:

a write enable control terminal; and a second address detection circuit having an input terminal and an output terminal, said second address detection circuit input terminal coupled to said write enable control terminal, said second address detection circuit output terminal coupled to one of said equalization circuit input terminals.

11. The circuit of claim 10 further comprising:

a first and second I/O bus line;

a transistor having a first, a second, and a third terminal, said transistor first terminal coupled to said first I/O bus line, said transistor second terminal coupled to said second I/O bus line, said transistor third terminal coupled to said equalization circuit output terminal.

12. The circuit of claim 11 wherein said equalization circuit switches said transistor on before said decode circuit changes its output.

* * * * *